United States Patent
Son (10) Patent No.: US 6,903,414 B2
(45) Date of Patent: Jun. 7, 2005

(54) SEMICONDUCTOR MEMORY HAVING CHANNEL REGIONS AT SIDES OF A TRENCH

(75) Inventor: Won So Son, Chungcheongbuk-do (KR)

(73) Assignee: Hyundai Electronics Industries, Co., Ltd., Kyoungki-do (KR)

( * ) Notice: Subject to any disclaimer, the term of this patent is extended or adjusted under 35 U.S.C. 154(b) by 0 days.

(21) Appl. No.: 10/223,656

(22) Filed: Aug. 20, 2002

(65) Prior Publication Data

US 2002/0195680 A1 Dec. 26, 2002

Related U.S. Application Data

(62) Division of application No. 09/629,099, filed on Jul. 31, 2000, now Pat. No. 6,465,299.

(30) Foreign Application Priority Data

Aug. 25, 1999 (KR) ........................................ 1999-35465

(51) Int. Cl.[7] .......................... H01L 29/76; H01L 29/94; H01L 31/062; H01L 31/113; H01L 31/119
(52) U.S. Cl. ........................................ 257/330; 257/906
(58) Field of Search ............................... 257/329, 330, 257/331, 332, 334, 368, 369, 906–908, 302, 306–308, 296, 513, 510, 449, 333; 438/242, 212, 270

(56) References Cited

U.S. PATENT DOCUMENTS

| | | | |
|---|---|---|---|
| 5,877,522 A | | 3/1999 | Kasai |
| 5,977,589 A | * | 11/1999 | Schloesser et al. |
| 6,022,779 A | * | 2/2000 | Shin et al. ................. 438/275 |
| 6,075,265 A | * | 6/2000 | Goebel et al. |
| 6,096,598 A | | 8/2000 | Furukawa et al. |
| 6,130,449 A | * | 10/2000 | Matsuoka et al. |
| 6,157,069 A | * | 12/2000 | Shin et al. ................. 257/390 |
| 6,172,391 B1 | * | 1/2001 | Goebel et al. |

* cited by examiner

Primary Examiner—Hoai Pham
Assistant Examiner—Dilinh Nguyen
(74) Attorney, Agent, or Firm—Birch, Stewart, Kolasch & Birch, LLP (57) ABSTRACT

Semiconductor memory and method for fabricating the same, the semiconductor memory including a cell transistor having a trench region formed in a semiconductor substrate and channel regions at sides of the trench region, source/drain regions formed in a bottom of the trench region and in a surface of the substrate adjacent to the trench region and in contact with the channel region, and gate electrodes at sides of the trench insulated from the trench wall.

2 Claims, 9 Drawing Sheets

SEMICONDUCTOR MEMORY HAVING CHANNEL REGIONS AT SIDES OF A TRENCH

This application is a divisional of application Ser. No. 09/629,099, filed on Jul. 31, 2000, now U.S. Pat. No. 6,465,299 the entire contents of which are hereby incorporated by reference and for which priority is claimed under 35 U.S.C. § 120; and this application claims priority of application Ser. No. P1999-35465 filed in KOREA on Aug. 25, 1999 under 35 U.S.C. § 119.

BACKGROUND OF THE INVENTION

1. Field of the Invention

The present invention relates to a semiconductor memory, and more particularly, to a semiconductor memory and a method for fabricating the same, which can increase a device packing density of the memory and reduce a step in a cell region and a peripheral circuit.

2. Background of the Related Art

Figure 1:
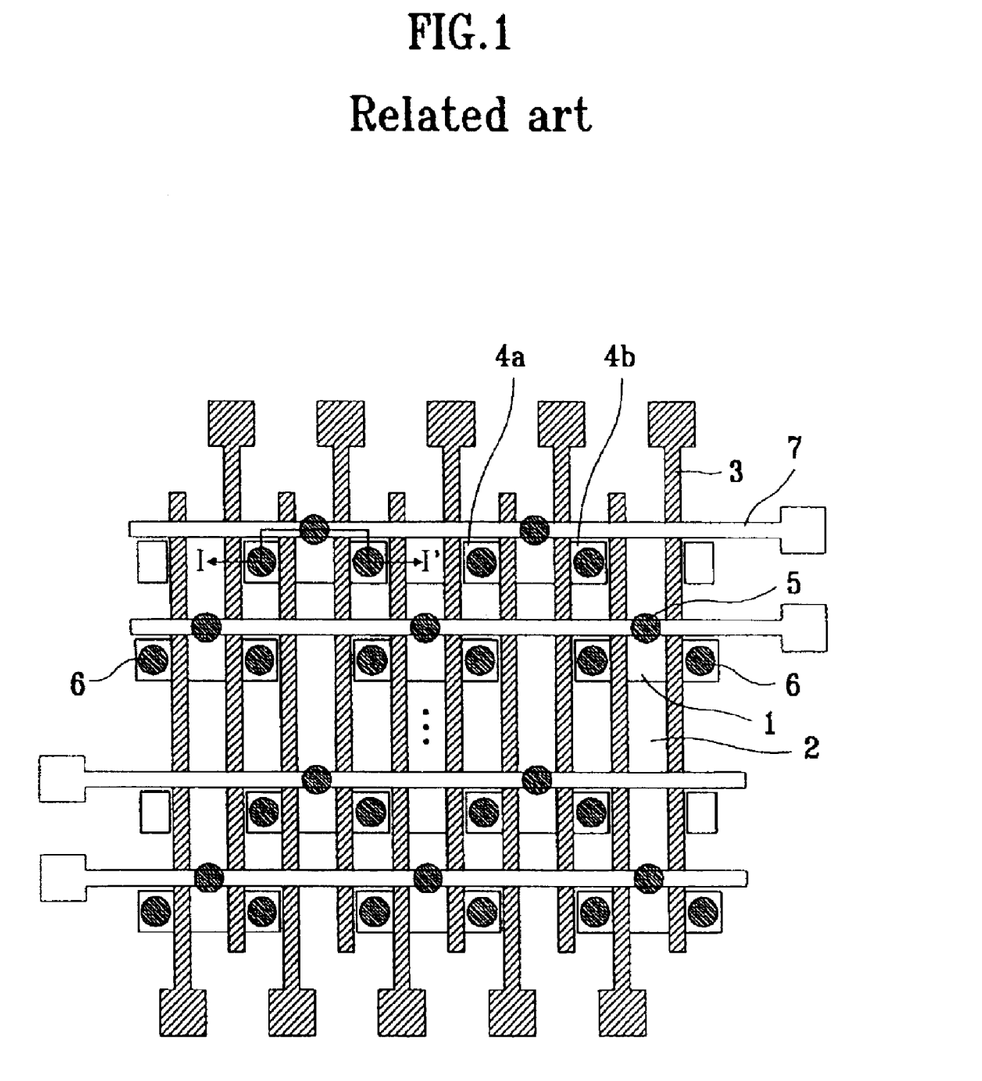
FIG. 1 illustrates a plan view of a related art semiconductor memory.
Figure 2:
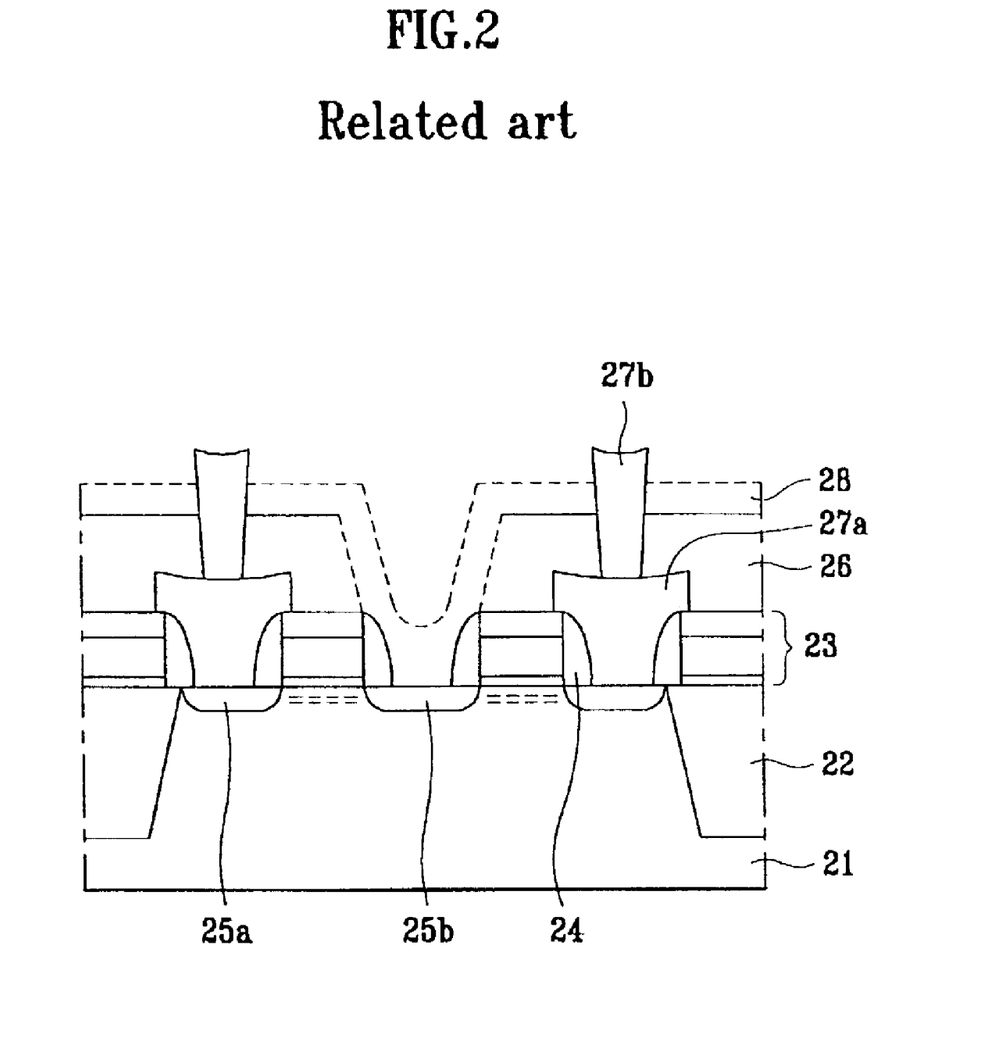
FIG. 2 illustrates a system of a unit cell of the related art semiconductor memory.

A related art semiconductor memory will be explained with reference to the attached drawings. FIG. 1 illustrates a plan view of a related art semiconductor memory, and FIG. 2 illustrates a system of a unit cell of the related art semiconductor memory. The related art semiconductor memory is provided with source/drain formed at the same height with a channel region, and a gate line formed at a height different from the source/drain.

Referring to FIG. 1, in the plan view, a semiconductor substrate is defined as active regions 1 and device isolation regions which isolate the active regions 1, and a wordline 3 is provided to cross the active region 1 in a short axis direction. The wordlines 3 are provided at fixed intervals, repeatedly. There are source/drain regions 4a and 4b in the active region 1 on both sides of each of the wordlines 3, a bitline contact layer 5 on the active region 1 between adjacent wordlines 3, and a storage node contact layer 6 on the active region 1 between adjacent wordlines 3 having no bitline contact layer 5 formed thereon. The bitline contact layer 5 is provided, not on a center of the active region 1, but at a position away from the center portion in some extent. This is because of difficulty of storage node contact when the bitline passes through the center portion in a memory of COB(Capacitor On Bitline). And a plurality of bitlines 7 are provided in a direction vertical to the wordlines 3.

A system of a unit cell of the related art semiconductor memory having the foregoing plan view will be explained.

Referring to FIG. 2, the unit cell of the related art semiconductor memory is provided with a device isolation layer 22 formed in a device isolation region of a semiconductor substrate 21 for defining an active region, gate electrodes(wordline) 23 formed on the active region, gate sidewalls 24 formed at sides of the gate electrodes 23, source/drain regions 25a and 25b formed in surfaces of the semiconductor substrate 21 on both sides of each of the gate electrodes 23, an interlayer insulating layer 26 formed on an entire surface inclusive of the cell transistor, a bitline 28 formed on the interlayer insulating layer 26 in contact with the source/drain regions 25b at one side of the cell transistor, a first storage node contact plug layer 27a in contact with the source/drain regions 25a at the other side of the cell transistor not in contact with the bitline 28, and a second storage node contact plug layer 27b connected to the first contact plug layer 27a. The layer with a reference numeral 28 shown in a dotted line represents the bitline. The bitline is shown in the dotted line because the bitline is, not on the sectional plane, but spaced from the sectional plane. The gate electrode 23 has a stack of a gate insulating film, a polysilicon layer and a cap insulating layer in succession. In the related art semiconductor memory, as the gate electrode 23 is formed on the surface of the semiconductor substrate 21, the source/drain 25a and 25b are formed at the same height with a channel region that is formed under the gate electrode 23.

However, the related art semiconductor memory has the following problems.

There has been a limitation in a photo processing because a length of the channel of the wordline becomes the shorter as an extent of the device packing advances. However, the related art semiconductor memory failed to suggest a method for solving this problem because the related art semiconductor memory has wordlines running in parallel to the surface of the substrate, that is not favorable for an easy fabrication and yield.

The repeated increase of a height of a cell capacitor for securing a cell capacitance causes to form a great step between the cell and the peripheral region, which makes conduction of following process difficult, and the two times of photo/etching required for storage node contact causes the fabrication process complicated.

SUMMARY OF THE INVENTION

Accordingly, the present invention is directed to a semiconductor memory and a method for fabricating the same that substantially obviates one or more of the problems due to limitations and disadvantages of the related art.

An object of the present invention is to provide a semiconductor memory and a method for fabricating the same, which can increase a device packing density and reduce a step between a cell region and a peripheral circuit.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor memory includes a cell transistor having a trench region formed in a semiconductor substrate and channel regions at sides of the trench region, source/drain regions formed in a bottom of the trench region and in a surface of the substrate adjacent to the trench region and in contact with the channel region, and gate electrodes at sides of the trench insulated from the trench wall.

In other aspect of the present invention, there is provided a method for fabricating a memory, including the steps of (1) selectively etching a semiconductor substrate inclusive of an active region and a device isolation region for isolating the active region, to form a trench for forming a plurality of wordlines, (2) implanting impurity ions in an entire surface inclusive of the trench for forming wordlines, (3) forming wordlines at sides of the trench for forming wordilines, (4) forming the insulating layer for protecting the wordlines and a planar first ILD (Inter layer dielectric) layer, and etching selectively, to form a bitline contact hole, (5) forming a bitline contact plug layer in the bitline contact hole, and forming a bitline in a direction vertical to the wordline, and (6) forming a second ILD layer on an entire surface, forming a storage node contact, and stuffing the storage node contact hole, to form a storage node contact plug layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 3:
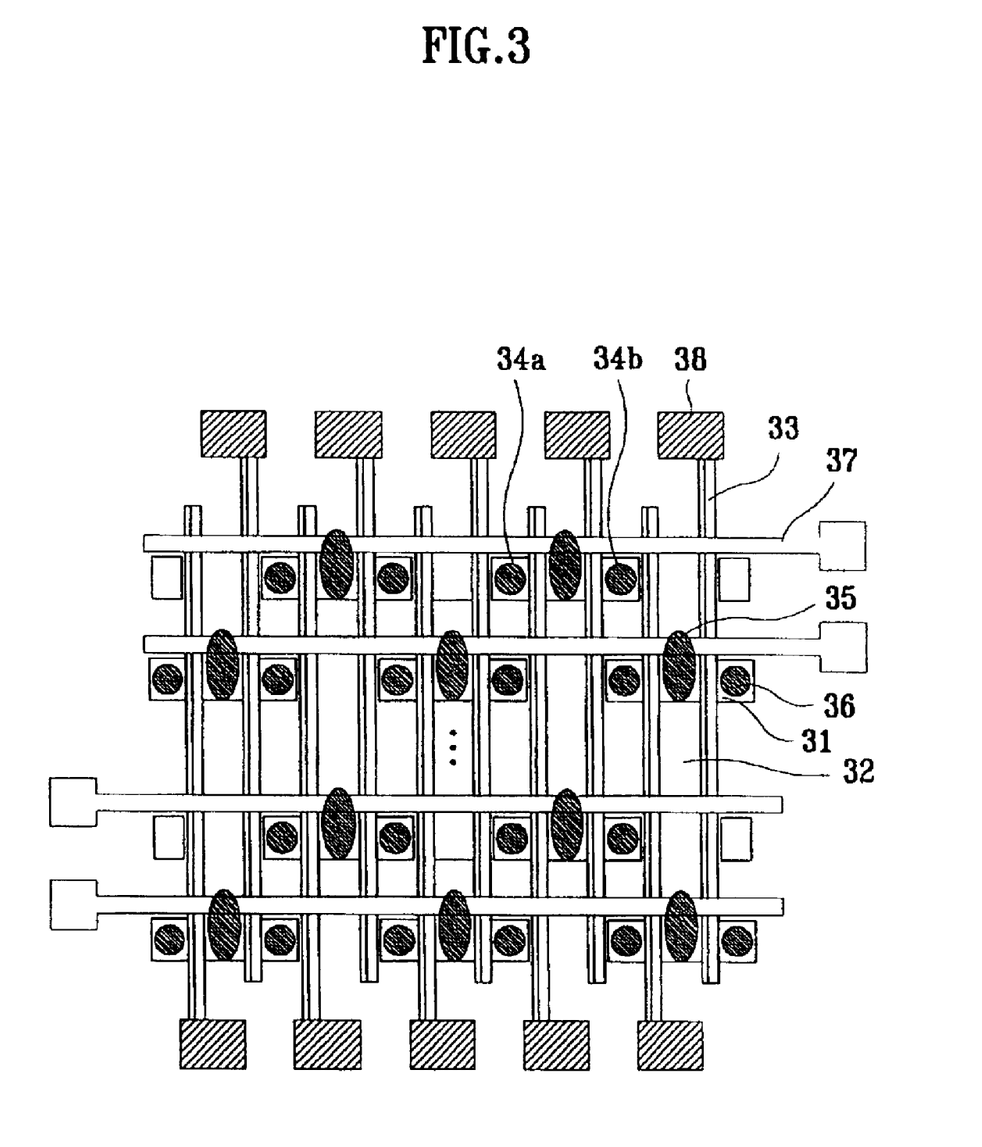
FIG. 3 illustrates a plan view of a semiconductor memory in accordance with a preferred embodiment of the present invention.
Figure 4:
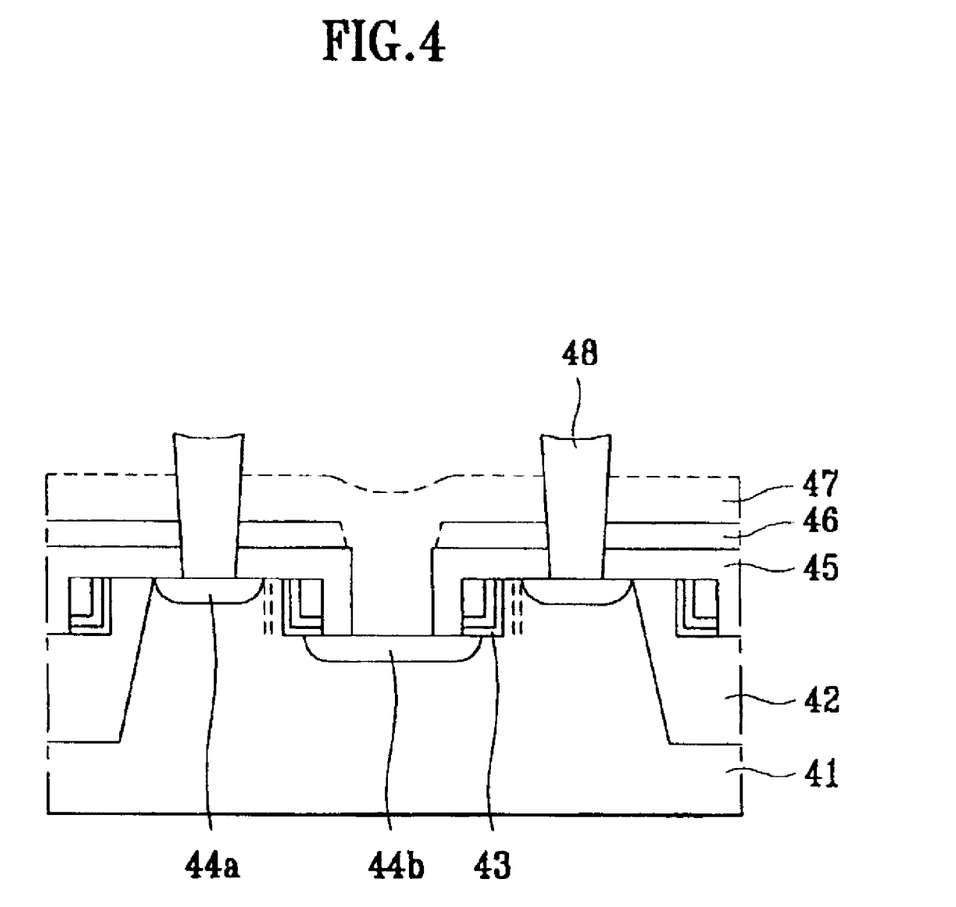
FIG. 4 illustrates a system of a unit cell of the semiconductor memory of the present invention.

Reference will now be made in detail to the preferred embodiments of the present invention, examples of which are illustrated in the accompanying drawings. FIG. 3 illustrates a plan view of a semiconductor memory in accordance with a preferred embodiment of the present invention, and FIG. 4 illustrates a system of a unit cell of the semiconductor memory of the present invention. The present invention suggests formation of a wordline at a position lower than a substrate for reducing a step.

Referring to FIG. 3, in the plan view, there is a semiconductor substrate having active regions 31 and device isolation regions 32 for insulating the active regions defined thereon, and wordlines 33 provided to cross the active regions 31 in a short axis direction. The wordlines 33 are provided repeatedly spaced from each other at fixed intervals. The wordlines 33 are provided, not on surfaces of the semiconductor substrate, but at sides of trenches formed in the substrate. There are source/drain regions 34a and 34b centered on the wordlines 33, not in the trench forming regions, but in surfaces of the substrate and bottom of the trenches, there are bitline contact layers 35 on active regions 31 between wordlines 33, and there are storage node contact layers 36 on the active regions 31 between the wordlines 33 having no bitline contact layers 35 formed thereon. The bitline contact layers 35 are not disposed at centers of the active regions 31, but disposed at positions spaced away from the center portion in some extent. Because, in a memory of a COB(Capacitor On Bitline) structure, contact of a storage node is difficult when the bitline passes through the center portion. There are a plurality of bitlines 37 provided in a direction vertical to the wordlines 33. There are wordline pads 38 at ends of the wordlines 33 formed at sides of the trenches.

A system of a unit cell of the semiconductor memory of the present invention having the foregoing planar system will be explained.

Referring to FIG. 4, the unit cell of the semiconductor memory of the present invention includes a device isolation layer 42 formed in a device isolation region of a semiconductor substrate 41 for defining an active region, a gate electrode (wordline) 43 formed at sides of a trench in the active region defined by the device isolation layer 42, source/drain regions 44a and 44b formed in a bottom of the trench having no gate electrode formed thereon and in a surface of the active region having no trench formed therein, an interlayer insulating layer 45 and an ILD (Inter layer dielectric) layer 46 formed on an entire surface in succession having a bitline contact hole and a storage node contact hole formed to expose the source/drain regions 44a and 44b, a bitline 47 for connecting to the source/drain 44b through the bitline contact hole, and a storage node plug layer 48 connecting to the source/drain 44a not in contact with the bitline 47 through the storage node contact hole. A layer with a reference numeral 47 shown in a dotted line in FIG. 4 is the bitline. The bitline is shown in the dotted line because the bitline is, not on a sectional plane, but spaced from the sectional plane. The gate electrode 43 includes a stack of a gate insulating film, a polysilicon layer, and an insulating layer in succession, wherein the gate insulating film and the polysilicon layer are provided at sides and a bottom surface of the trench. The insulating layer, a cap oxide film, is formed at a height the same with the gate electrode 43. Because the semiconductor memory of the present invention has the, gate electrode 43 formed under a surface of the semiconductor substrate 41, a channel region is formed vertical to the surface of the substrate. And, the source and the drain have different horizontal heights.

A method for fabricating the aforementioned semiconductor memory in accordance with a preferred embodiment of the present invention will be explained. FIGS. 5A~5H illustrate layouts and sections across line II-II' of semiconductor memories, showing the steps of a method for fabricating a semiconductor memory in accordance with a preferred embodiment of the present invention.

Figure 5A:
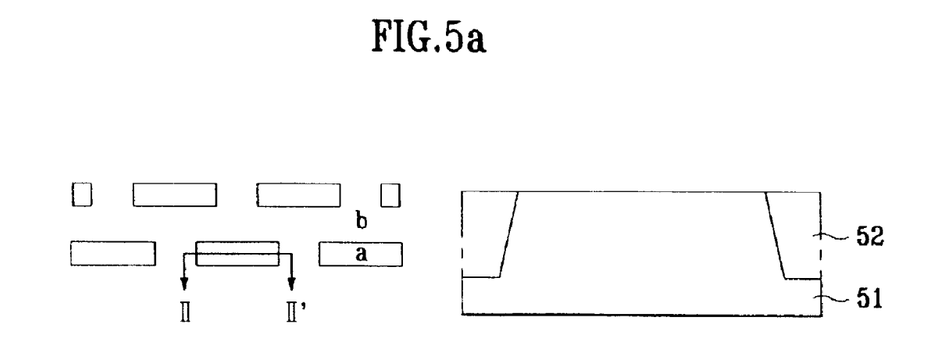
FIGS. 5A~5H illustrate layouts and sections across line II—II' of semiconductor memories, showing the steps of a method for fabricating a semiconductor memory in accordance with a preferred embodiment of the present invention; and, FIGS. 6A~6E illustrate layouts and sections across line III—III' of semiconductor memories, showing the steps of a method for fabricating a semiconductor memory in accordance with another preferred embodiment of the present invention.
Figure 5B:
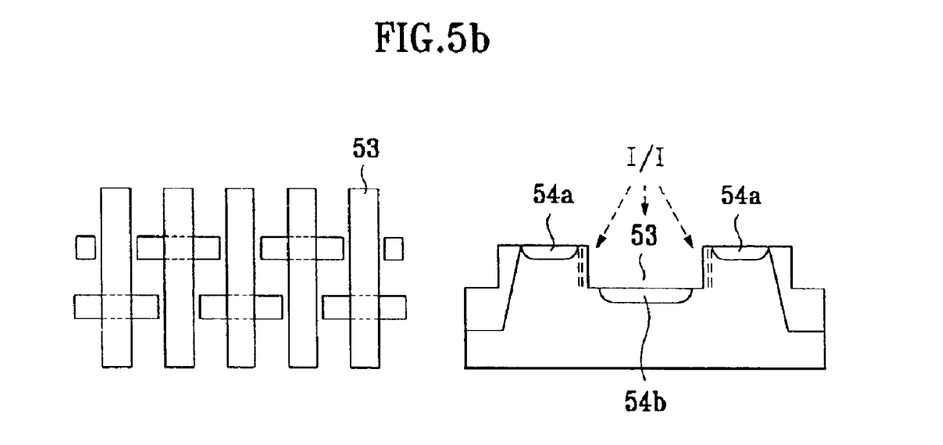
Figure 5C:
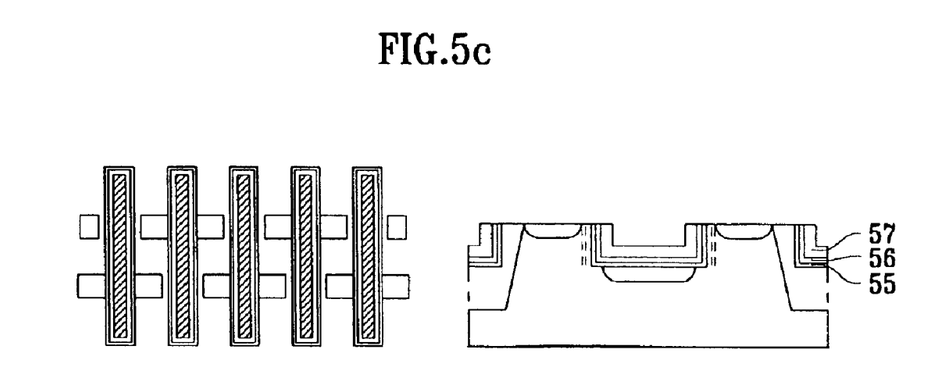
Figure 5D:
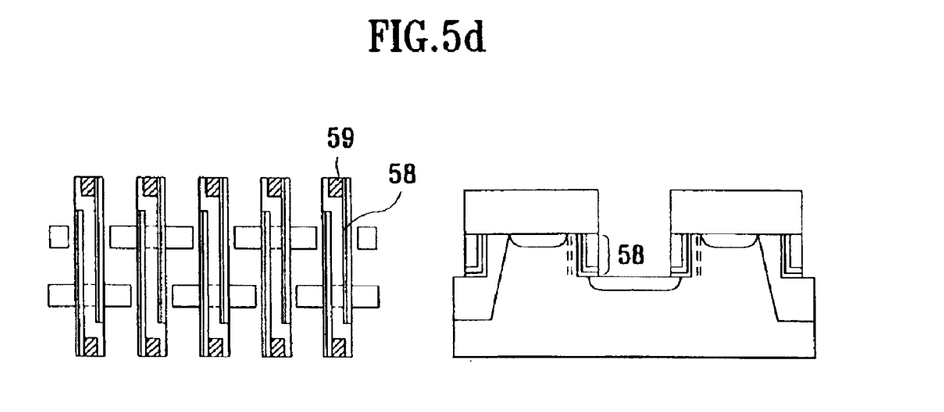
Figure 5E:
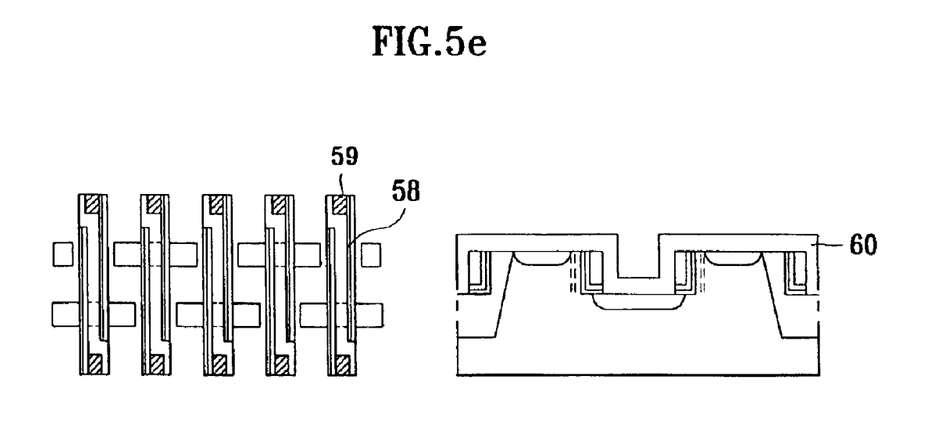
Figure 5F:
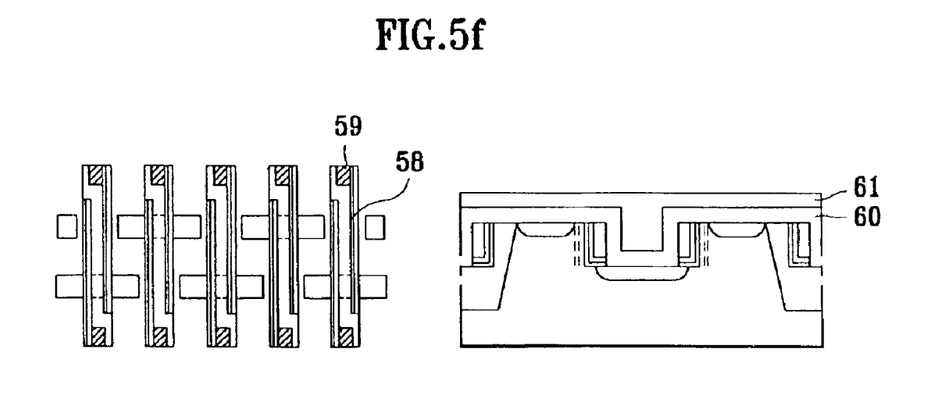
Figure 5G:
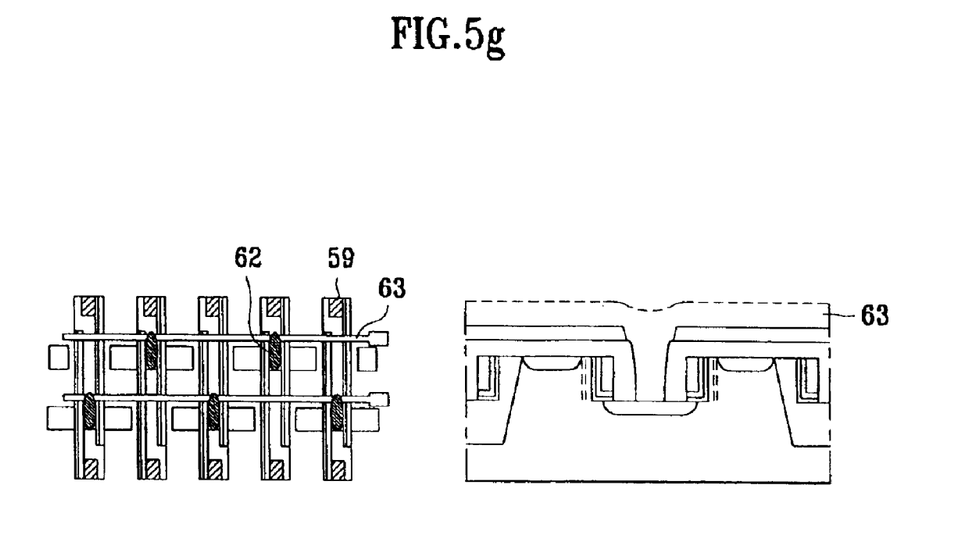
Figure 5H:
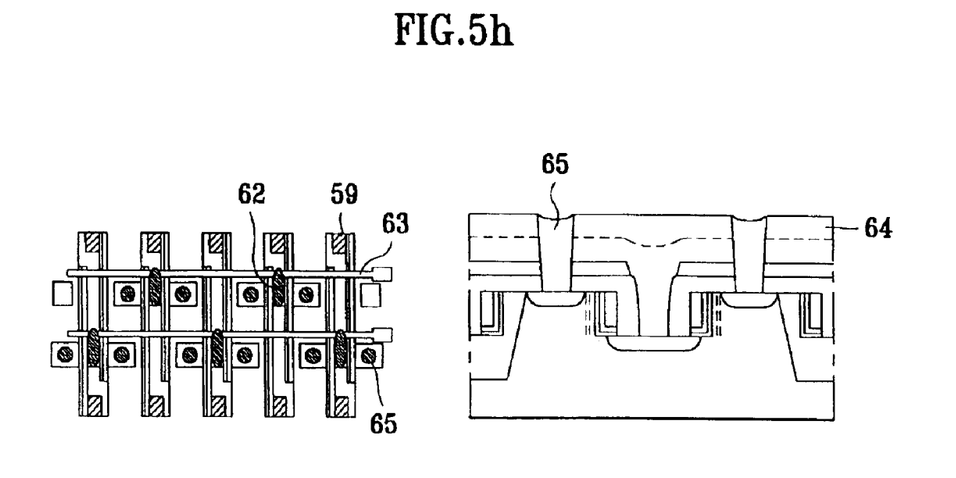

Referring to FIG. 5A, the method for fabricating a semiconductor memory in accordance with a preferred embodiment of the present invention starts with forming a device isolation layer 52 in a device isolation region 'a' of a semiconductor substrate 51, to define an active region 'b'. As shown in FIG. 5B, the semiconductor substrate 51 is etched selectively to form a trench 53 for forming a plurality of wordlines crossing the active region 'b' in a short axis direction. Impurity ions are implanted in an entire surface inclusive of the trench 53 for forming the wordline, to form source/drain regions 54a and 54b. And, as shown in FIG. 5C, a gate oxide film 55 is formed on an entire surface inclusive of the trench, and a polysilicon layer 56 and a silicide layer 57 are formed in succession on the gate oxide film 55. Then, the silicide layer 57 and the polysilicon layer 56 are selectively removed from portions excluding the trench regions by CMP (Chemical Mechanical Polishing). As shown in FIG. 5D, a portion of the gate oxide film 55 in contact with sides of the trench 53 for forming a wordline, the polysilicon layer 56, and the silicide layer 57 are selectively left by photolithography, to form a gate electrode(wordline) 58. In this instance more gate oxide film 55, polysilicon layer 56, and silicide layer 57 are left at an end of the wordline in formation of the wordline than other regions, to form a wordline pad 59. As shown in FIG. 5E, an insulating layer 60, for example, a nitride layer is formed for protection of the gate electrode 58 in a following self align contact process. As shown in FIG. 5F, a planar first ILD layer 61 is formed on an entire surface of the insulating layer 60. As shown in FIG. 5G, the first ILD layer 61 and the insulating layer 60 are etched selectively, to form a bitline contact hole, and a polysilicon layer is deposited thereon and etched back, to form a bitline contact plug layer 62 in a form extended to outside of the active region. And, a bitline(a dotted line in FIG. 5G) 63 is formed in a direction vertical to the wordline, to pass through, not the active region, but the device isolation region for easy storage node contact later. That is, the bitline 63 is formed such that the bitline 63 passes over the extended portion of the bitline contact plug layer 62. The bitline 63 is represented in a dotted line in FIG. 5G because the bitline is not on the sectional plane. Then, as shown in FIG. 5H, a second ILD layer 64 is formed on an entire surface inclusive of the bitline 63, and the first and second ILD layers 61 and 63 and the insulating layer 60 are removed selectively, to form a storage node contact hole. A polysilicon layer is formed on an entire surface inclusive of the storage node contact hole, and etched back, to form a storage node contact plug layer 65. And, though not shown on the drawing, a storage node in contact with the storage node contact plug layer 65, a dielectric layer and a plate electrode are formed in succession, to form a capacitor.

A method for fabricating a semiconductor memory in accordance with another preferred embodiment of the present invention will be explained. FIGS. 6A~6E illustrate layouts and sections across line III—III' of semiconductor memories, showing the steps of a method for fabricating a semiconductor memory in accordance with another preferred embodiment of the present invention. The another embodiment of the present invention suggests to fabricate a semiconductor memory having source/drain regions formed in a bottom surface of a trench by ion implantation, and a storage node contact of a doped polysilicon layer formed on the active region except the trench region.

Figure 6A:
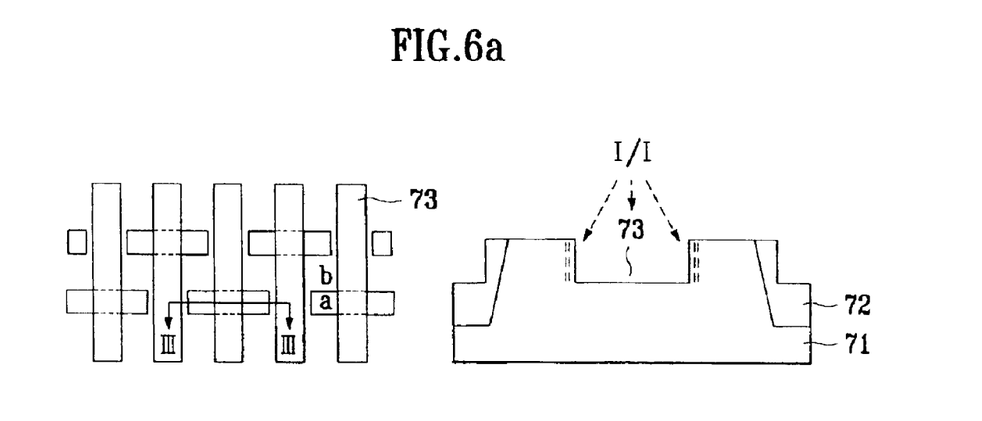
Figure 6B:
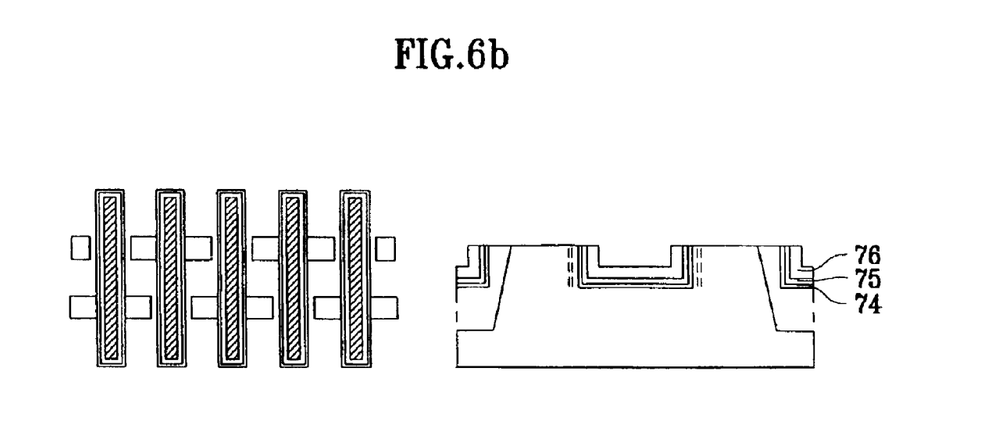
Figure 6C:
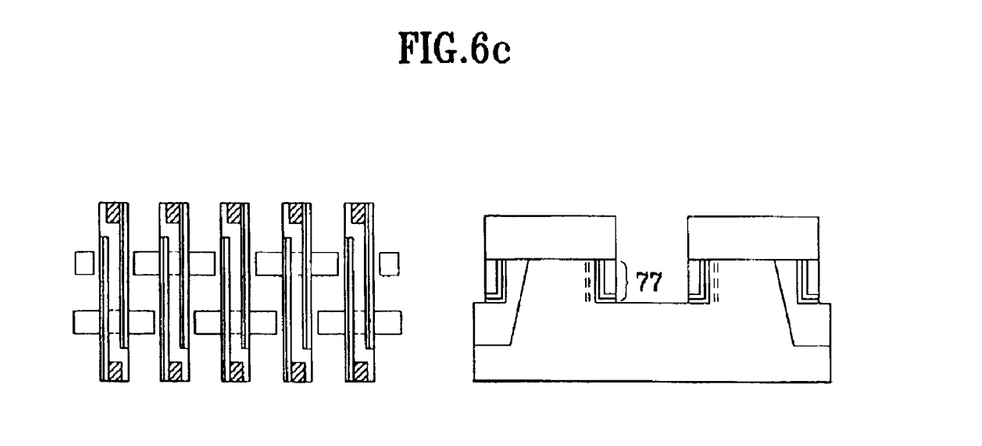
Figure 6D:
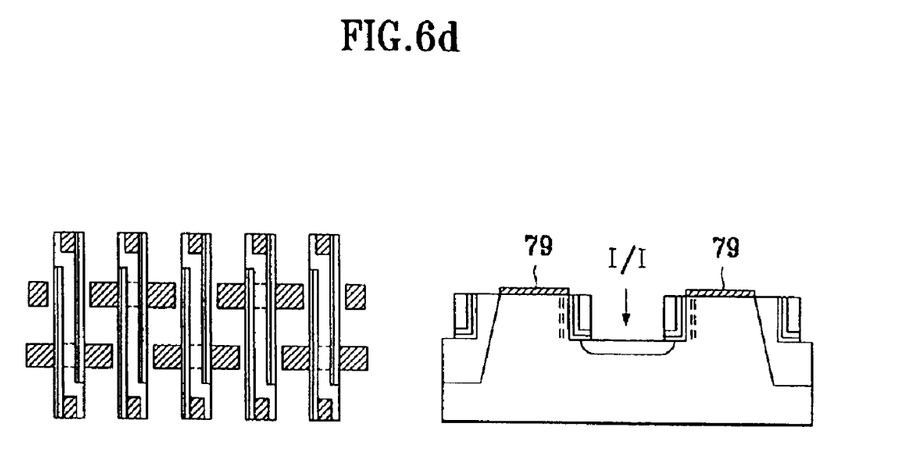
Figure 6E:
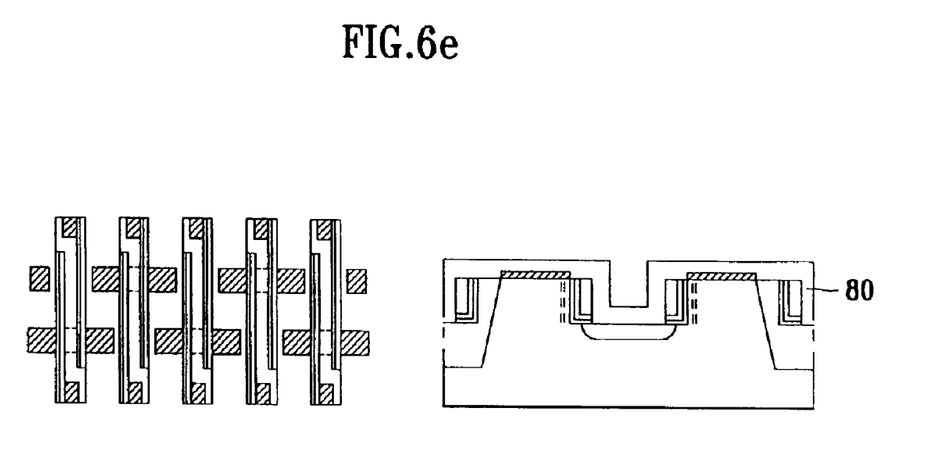

Referring to FIG. 6A, the method for fabricating a semi-conductor memory in accordance with another preferred embodiment of the present invention starts with forming a device isolation layer 72 in a device isolation region 'a' of a semiconductor substrate 71, to define an active region 'b'. The semiconductor substrate 71 is etched selectively, to form a trench 73 for forming a plurality of wordlines crossing the active region 'b' in a short axis direction. A channel ion implantation process is conducted for sides of the trench 73 for forming the wordline, for adjusting a device threshold voltage. And, as shown in FIG. 6B, a gate oxide film 74 is formed on an entire surface inclusive of the trench, and a polysilicon layer 75 and a silicide layer 76 are formed on the gate oxide film 74 in succession. Then, the suicide layer 76 and the polysilicon layer 75 are removed selectively from portions except a trench region by CMP. As shown in FIG. 6C, the gate oxide film 74, the polysilicon layer 75 and the silicide layer 76 in contact with a side of the trench 73 for forming the wordline are selectively left by photolithography to form a gate electrode(wordline) 77. In this instance, in the formation of the wordline, more gate oxide film 74, polysilicon layer 75 and silicide layer 76 are left at an end of the wordline, to form a wordline pad 78. As shown in FIG. 6D, a doped polysilicon layer 79 is deposited on a surface of the active region having no trench formed therein. The polysilicon layer 79 acts as a storage node contact layer and source/drain. As shown in FIG. 6E, an insulating layer 80, for example, a nitride layer, is formed for protection of the gate electrode 77 in a following self align contact process. Following fabrication steps are conducted the same with the steps explained in connection with FIGS. 5F~5H.

The semiconductor memory and method for fabricating the same of the present invention has the following advantages owing to the formation of the wordline in the trench region formed in the substrate.

First, since a channel width is fixed, not by separate photolithography, but by a trench depth, the wordline can be formed in a size below a resolution limitation of a photo process. That is, even in a case when the wordline has a width below 0.2 $\mu$m, devices with higher device packing densities can be fabricated without help from any additional equipments.

Second, the formation of the wordline to a height identical to a height of a substrate surface reduces a step between a cell region and a peripheral circuit region, that is favorable for planarization.

Third, the strip form of active region facilitates to improve a device packing density.

Fourth, the formation of the storage node contact, not by two times of photo and etch processes, but by one time of photo and etch processes, can simplify the fabrication process.

It will be apparent to those skilled in the art that various modifications and variations can be made in the semiconductor memory and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A semiconductor memory comprising:

a semiconductor substrate having an active region and a device isolation layer for isolating the active region;

a trench formed to cross the active region in a fixed width;

wordlines formed along sides of the trench;

gate insulating layers formed between the wordlines and the active region;

a first impurity region formed in a bottom portion of the trench having no wordline passed therethrough;

second impurity regions formed at surfaces of the semi-conductor substrate adjacent to the trench;

a first insulating layer formed on an entire surface having contact holes to the first and second impurity regions;

a bitline formed in a direction vertical to the wordline and in contact with the first impurity region through the contact hole in the first insulating layer;

a second insulating layer formed on an entire surface inclusive of the bitline; and, a storage node plug layers formed in contact with the second impurity region.

2. A semiconductor memory as claimed in claim 1, wherein a bitline contact layer is provided between the bitline and the first impurity region and a position of the bitline contact layer is, not a center portion of the active region, but spaced away from the center portion of the active region.

* * * * *